(12) United States Patent
Han et al.

(10) Patent No.: US 10,367,569 B2
(45) Date of Patent: Jul. 30, 2019

(54) PHASE ARRAY RECEIVER

(71) Applicant: ELECTRONICS AND TELECOMMUNICATIONS RESEARCH INSTITUTE, Daejeon (KR)

(72) Inventors: Seon-Ho Han, Daejeon (KR); Bon Tae Koo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/921,424

(22) Filed: Mar. 14, 2018

(65) Prior Publication Data

US 2018/0359019 A1    Dec. 13, 2018

(30) Foreign Application Priority Data

Jun. 7, 2017  (KR) .................. 10-2017-0070968

(51) Int. Cl.
*H04B 7/08*  (2006.01)
*H04B 1/16*  (2006.01)
(Continued)

(52) U.S. Cl.
CPC .............. *H04B 7/0897* (2013.01); *H01Q 3/36* (2013.01); *H01Q 3/42* (2013.01); *H03D 7/1441* (2013.01);
(Continued)

(58) Field of Classification Search
CPC .......... H04B 1/40; H04B 7/0897; H04B 7/10; H04B 7/06; H01Q 3/42; H04L 5/14;
(Continued)

(56) References Cited

U.S. PATENT DOCUMENTS 8,203,394 B2    6/2012  Kim et al.
8,774,747 B2    7/2014  Hyun et al.
(Continued)

FOREIGN PATENT DOCUMENTS

KR    10-2001-0065759 A    7/2001

OTHER PUBLICATIONS

Dong-Woo Kang et al., "Single and Four-Element Ka-Band Transmit/Receive Phased-Array Silicon RFICs With 5-bit Amplitude and Phase Control", IEEE Transactions on Microwave Theory and Techniques, Dec. 2009, pp. 3534-3543, vol. 57, No. 12, IEEE.

(Continued)

*Primary Examiner* — Thanh C Le

(57) ABSTRACT

Provided is a phase array receiver. A phase array receiver according to an embodiment of the present invention includes a plurality of antennas, a plurality of low-noise amplifiers, a plurality of phase shifters, a plurality of transconductors, and a frequency mixer. A plurality of low-noise amplifiers amplify RF signals received from the plurality of antennas. The plurality of phase shifters adjusts the phase of the RF signals to generate a plurality of RF phase adjustment signals. The plurality of transconductors convert a plurality of RF phase adjustment signals into a plurality of RF current signals based on the gain control signal. The frequency mixer converts a sum of the plurality of RF current signals into a mixed current signal. According to the inventive concept, the linearity of the signal processing may be improved and the area for the implementation of the phase array receiver may be reduced.

15 Claims, 6 Drawing Sheets

(51) Int. Cl.
  *H03F 3/19* (2006.01)
  *H03F 3/45* (2006.01)
  *H03D 7/14* (2006.01)
  *H01Q 3/42* (2006.01)
  *H03G 3/30* (2006.01)
  *H01Q 3/36* (2006.01)
  *H03D 7/16* (2006.01)

(52) U.S. Cl.
  CPC ......... *H03D 7/1458* (2013.01); *H03D 7/1466* (2013.01); *H03D 7/165* (2013.01); *H03F 3/19* (2013.01); *H03F 3/45076* (2013.01); *H03G 3/3036* (2013.01); *H04B 1/16* (2013.01); *H03F 2200/294* (2013.01); *H03F 2200/451* (2013.01); *H03G 2201/103* (2013.01); *H03G 2201/307* (2013.01)

(58) Field of Classification Search
  CPC .......... H03F 3/19; H03F 3/24; H03F 3/45076; H03F 3/45125; H03F 3/3036
  See application file for complete search history.

(56) References Cited

U.S. PATENT DOCUMENTS

| 2007/0058703 | A1* | 3/2007 | Behzad | H03F 3/24 |
|---|---|---|---|---|
| | | | | 375/219 |
| 2009/0251368 | A1 | 10/2009 | McCune, Jr. | |
| 2009/0258623 | A1 | 10/2009 | Connell et al. | |
| 2011/0150138 | A1 | 6/2011 | Park et al. | |
| 2012/0258679 | A1 | 10/2012 | Chang | |
| 2014/0132450 | A1 | 5/2014 | Chen et al. | |
| 2016/0020793 | A1 | 1/2016 | McCullagh | |
| 2018/0269919 | A1* | 9/2018 | Gharavi | H04B 7/10 |

OTHER PUBLICATIONS

Kwang-Jin Koh et al., "An X- and Ku-Band 8-Element Phased-Array Receiver in 0.18-um SiGe BiCMOS Technology", IEEE Journal of Solid-State Circuits, Jun. 2008, pp. 1360-1371. vol. 43, No. 6, IEEE.

Moon-Kyu Cho et al., "An X-Band 5 Bit Phase Shifter With Low Insertion Loss in 0.18 um SOI Technology", IEEE Microwave and Wireless Components Letters, Dec. 2012, pp. 648-650, vol. 22, No. 12, IEEE.

\* cited by examiner

US 10,367,569 B2

PHASE ARRAY RECEIVER

CROSS-REFERENCE TO RELATED APPLICATIONS

This U.S. non-provisional patent application claims priority under 35 U.S.C. § 119 of Korean Patent Application No. 10-2017-0070968, filed on Jun. 7, 2017, the entire contents of which are hereby incorporated by reference.

BACKGROUND

The present disclosure relates to RF signal processing for wireless communication, and more particularly to a phase array receiver.

In the field of wireless communication, a receiving device may be implemented so as to receive a signal for a particular direction and not to receive a signal for an undesired direction. Beamforming techniques using a phase array receiver are emerging to ensure the accuracy, reliability, and efficiency of such signal reception. The beam forming techniques refer to techniques of processing transmission signals or reception signals so that the energy radiated from an antenna is concentrated in a specific direction.

A phase array receiver for beamforming may be implemented in various structures. For example, a phase array receiver may be implemented with a radio frequency (RF) beam forming structure, a local oscillator (LO) beam forming structure, a baseband analog beam forming structure, and a digital beam forming structure. Among them, the RF beam forming structure is a structure that performs phase shifting and RF signal combining before a frequency mixer. Such an RF beam forming structure requires a small number of components and has an advantage in that the routing is simple. In addition, the RF beam forming structure has the advantage of spatially filtering an interference signal in an RF reception path before mixing RF frequencies.

Various demands are raised to improve the performance of a phase array receiver in an RF beam forming structure. In recent years, there is a demand for a phase array receiver that has a simple structure and improves the linearity.

SUMMARY

The present disclosure provides a phase array receiver that may be implemented in a small size, may process a wide band signal, and may improve the linearity of signal processing.

A phase array receiver according to an embodiment of the inventive concept includes a plurality of antennas, a plurality of low-noise amplifiers, a plurality of phase shifters, a plurality of transconductors, a frequency mixer, a transimpedance amplifier, and a reception controller. The plurality of antennas receive an RF signal. The low-noise amplification unit 120 amplifies the RF signal to generate a plurality of RF amplification signals. The plurality of phase shifters adjusts the phases of the plurality of RF amplified signals to generate a plurality of RF phase adjustment signals. The plurality of phase shifters determines the reception direction of the RF signal.

The plurality of transconductors convert the plurality of voltage signals generated based on the RF signal into a plurality of RF current signals. For example, a plurality of transconductors may convert a plurality of RF phase adjustment signals into a plurality of RF current signals based on a gain control signal. The plurality of transconductors are electrically connected to the summation node and output a plurality of RF current signals to the summation node. Each of the plurality of transconductors may have different current conversion ratios for side lobe removal. The plurality of transconductors may be composed of the same number as the plurality of antennas.

The frequency mixer receives a summed RF current signals from the summation node. The frequency mixer converts the frequency of the plurality of RF current signals to generate a mixed current signal. The frequency mixer may include a passive frequency mixer that generates a mixed current signal having a lower output frequency band than a sum of a plurality of RF current signals based on the local oscillation signal. For example, the frequency mixer may include a first passive frequency mixer that generates a first mixed current signal based on the first local oscillator signal and a second passive frequency mixer that generates a second mixed current signal based on a second local oscillator signal that is orthogonal to the first local oscillator signal. The transimpedance amplifier converts the mixed current signal into a mixed voltage signal.

The reception controller generates a gain control signal. The reception controller may control the current conversion ratio of a plurality of transconductors based on the gain control signal. The reception controller may provide a phase and gain control signal to the plurality of phase shifters that determine the reception direction of the RF signal. The reception controller may determine the phase shift amount of the plurality of phase shifters. The reception controller may generate a low-noise amplifier control signal that controls the amplification gain of the plurality of low-noise amplifiers. The phase array receiver may differentially output a plurality of RF amplified signals, a plurality of RF phase adjustment signals, a plurality of RF current signals, a mixed current signal, and a mixed voltage signal, for example.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

In the following, embodiments of the inventive concept will be described in detail so that those skilled in the art easily carry out the inventive concept.

Figure 1:
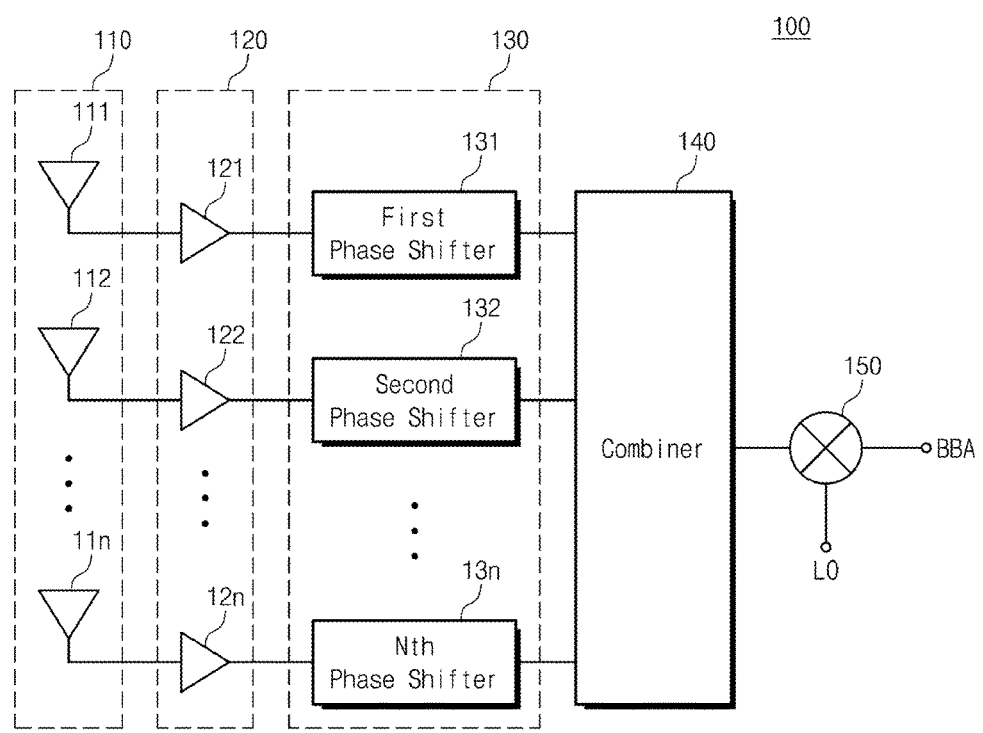
FIG. 1 is a block diagram of a phase array receiver.

FIG. 1 is a block diagram of a phase array receiver. Referring to FIG. 1, a phase array receiver 100 includes an antenna unit 110, a low-noise amplification unit 120, a phase adjustment unit 130, a combiner 140, and a frequency mixer 150. The phase array receiver 100 may receive an RF signal from an external transmission device.

The antenna unit 110 includes first to nth antennas 111 to 11n. The first to nth antennas 111 to 11n receive a radio frequency (RF) signal. The first to nth antennas 111 to 11n may form a beam in a specific direction. The first to nth antennas 111 to 11n may form a beam in a reception direction of an RF signal. The first to nth antennas 111 to 11n may form a beam having the maximum gain in the reception direction of the RF signal. The antenna unit 110 may include an array of the first to nth antennas 111 to 11n having multiple channels to form the beam.

The low-noise amplification unit 120 includes first to nth low-noise amplifiers 121 to 12n. The first to nth low-noise amplifiers 121 to 12n receive RF signals from the first to the nth antennas 111 to 11n. The first low-noise amplifier 121 may be electrically connected to the first antenna 111. The second low-noise amplifier 122 may be electrically connected to the second antenna 112. The nth low-noise amplifier 12n may be electrically connected to the nth antenna 11n. The first to nth antennas 111 to 11n may provide corresponding RF signals to the first to nth low-noise amplifiers 121 to 12n. For example, the RF signal includes first to nth RF signals. In this case, the first low-noise amplifier 121 may receive the first RF signal from the first antenna 111 and the second low-noise amplifier 122 may receive the second RF signal from the second antenna 112.

The low-noise amplification unit 120 may amplify the RF signal received from the antenna unit 110 with low-noise. The low-noise amplification unit 120 may amplify the RF signal based on the amplification gain of each of the first to nth low-noise amplifiers 121 to 12n. The low-noise amplification unit 120 may amplify the noise as well as the RF signal, and furthermore, the noise of the amplifier itself may be added to the output. The low-noise amplification unit 120 minimizes the noise index corresponding to the ratio of the signal-to-noise ratio (SNR) of the input terminal to the SNR of the output terminal. The noise index of the phase array receiver 100 depends on the noise index of the first amplifier. Accordingly, the RF signal received by the antenna unit 110 amplifies the RF signal using the low-noise amplification unit 120.

The low-noise amplification unit 120 amplifies the RF signal to generate an RF amplification signal. The first to nth low-noise amplifiers 121 to 12n amplify the RF signal to generate a plurality of RF amplified signals. For example, the first low-noise amplifier 121 may amplify the first RF signal to generate a first RF amplification signal. The second low-noise amplifier 122 may amplify the second RF signal to generate a second RF amplification signal.

The phase adjustment unit 130 includes first to nth phase shifters 131 to 13n. The first phase shifter 131 may be electrically connected to the first low-noise amplifier 121. The second phase shifter 132 may be electrically connected to the second low-noise amplifier 122. The nth phase shifter 13n may be electrically connected to the nth low-noise amplifier 12n. The first to nth phase shifters 131 to 13n may receive corresponding RF amplification signals from the first to nth low-noise amplifiers 121 to 12n, respectively. For example, the first phase shifter 131 may receive a first RF amplification signal from the first low-noise amplifier 121.

The phase adjustment unit 130 adjusts the phases of a plurality of RF amplification signals received from the low-noise amplification unit 120. The phase adjustment unit 130 may delay the phase of the RF amplification signal based on the phase control signals provided to the first through nth phase shifters 131 through 13n. The phase shift amounts of the first to nth phase shifters 131 to 13n may be different from each other. The phase shift amount of each of the first to nth phase shifters 131 to 13n may be determined based on a reception direction for reception of an RF signal. That is, the beam forming direction of the phase array receiver 100 may be determined based on the phase shift amount of each of the first to nth phase shifters 131 to 13n. The phase adjustment unit 130 may control the phase difference of the signals received from the first to the nth antennas 111 to 11n to form a beam.

The phase adjustment unit 130 may receive a gain control signal provided to each of the first to nth phase shifters 131 to 13n. The magnitude of the RF amplification signal may be determined based on the gain control signal. The gain of each of the first to nth phase shifters 131 to 13n may be different from each other. For example, the gain of each of the first to nth phase shifters 131 to 13n may be determined in consideration of the beam size. The gain of each of the first to nth phase shifters 131 to 13n may be determined in consideration of minimizing the side lobe generated at the time of beam forming.

The phase adjustment unit 130 adjusts the phase and gain of the plurality of RF signals to generate a plurality of RF phase adjustment signals. The first to nth phase shifters 131 to 13n may adjust the phase and gain of the received RF amplification signal. For example, the first phase shifter 131 may adjust the phase and gain of the first RF signal to generate a first RF phase adjustment signal. The second phase shifter 132 may adjust the phase and gain of the second RF signal to generate a second RF phase adjustment signal. As a result of the phase adjustment of the first to nth phase shifters 131 to 13n, the phase adjustment unit 130 may provide the first to nth RF phase adjustment signals to a combiner 140 at the same timing.

The combiner 140 receives a plurality of RF phase adjustment signals from the phase adjustment unit 130. The combiner 140 combines all of the plurality of RF phase adjustment signals to generate one combined signal. The combiner 140 may combine the power of each of the plurality of RF phase adjustment signals. The combiner 140 provides the combined signal to the frequency mixer 150. The combiner 140 may include a passive power signal combiner for combining a plurality of RF phase adjustment signals. As an example of a passive power signal combiner, the combiner 140 may include a Wilkinson Combiner. Alternatively, the combiner 140 may include an active power signal combiner for combining a plurality of RF phase adjustment signals.

When the combiner 140 combines a plurality of RF phase adjustment signals using a passive power signal combiner, the power consumption of the combiner 140 itself may be minimized. However, the passive power signal combiner requires a larger area than the active power signal combiner. Particularly, when combining a signal of a low band frequency, the area for implementing a passive power signal combiner may be greatly increased, making it difficult to implement an integrated circuit. When the combiner 140 combines a plurality of RF phase adjustment signals using an active power signal combiner, the area for implementing the active power signal combiner may be reduced. However, the active power signal combiner may consume more power than the passive power signal combiner. Embodiments to be described below may be provided to reduce the implementation area while reducing the power consumption of the phase array receiver 100.

The frequency mixer 150 receives the combination signal from the combiner 140. The frequency mixer 150 may include a passive frequency mixer or may include an active frequency mixer. The frequency mixer 150 converts the combined RF signal into a low frequency band. The frequency mixer 150 generates a baseband analog signal BBA having an output frequency band lower than the RF signal. The frequency mixer 150 may receive a local oscillation signal LO. The frequency mixer 150 may convert the combined RF signal into a baseband analog signal BBA based on the local oscillation signal LO.

Figure 2:
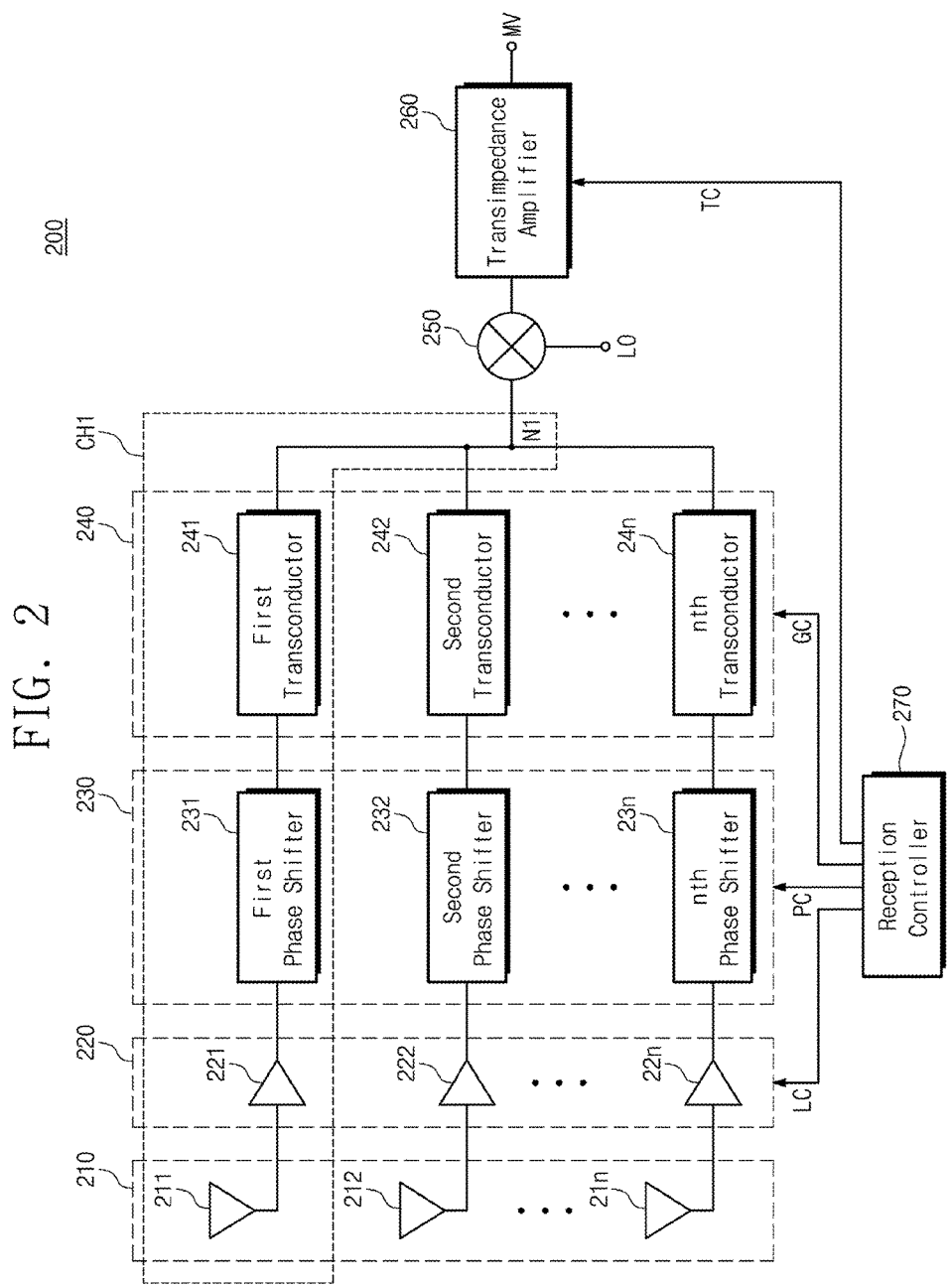
FIG. 2 is a block diagram of a phase array receiver according to an embodiment of the inventive concept.

FIG. 2 is a block diagram of a phase array receiver according to an embodiment of the inventive concept. Referring to FIG. 2, the phase array receiver 200 includes an antenna unit 210, a low-noise amplification unit 220, a phase adjustment unit 230, a transconductor unit 240, a frequency mixer 250, a transimpedance amplifier 260, and a reception controller 270. The antenna unit 210 includes first to nth antennas 211 to 21n. The antenna unit 210 of FIG. 2 may have the same configuration as the antenna unit 110 of FIG. 1. The phase array receiver 200 may include as many channels as the number of antennas included in the antenna unit 210. In the case of FIG. 2, the phase array receiver 200 may include n channels.

The low-noise amplification unit 220 includes first to nth low-noise amplifiers 221 to 22n. The low-noise amplification unit 220 of FIG. 2 may have the same configuration as the low-noise amplification unit 120 of FIG. 1. The low-noise amplification unit 220 receives a low-noise amplifier control signal LC. The first to nth low-noise amplifiers 221 to 22n may control the gain of the RF signal inputted based on the low-noise amplifier control signal LC. The low-noise amplification unit 220 controls the gain of the RF signal to generate a plurality of RF amplification signals.

The phase adjustment unit 230 includes first to nth phase shifters 231 to 23n. The phase adjustment unit 230 of FIG. 2 may have the same configuration as the phase adjustment unit 130 of FIG. 1. The phase adjustment unit 230 receives a phase and gain control signal PC. The first to nth phase shifters 231 to 23n may control the phase and gain of each of the plurality of RF amplification signals based on the phase and gain control signals PC. That is, the phase adjustment unit 230 may control the reception direction and the magnitude of the RF signal based on the phase and gain control signals PC. The phase adjustment unit 230 generates a plurality of RF phase adjustment signals based on the phase and gain control signals PC. FIG. 2 illustrates that the low-noise amplification unit 220 receives the RF signal received from the antenna unit 210 to generate a plurality of RF amplification signals and the phase adjustment unit 230 adjusts the phase of a plurality of RF amplification signals, but the inventive concept is not limited thereto. For example, the arrangement of the phase adjustment unit 230 and the low-noise amplification unit 220 may be interchanged.

The transconductor unit 240 includes first to nth transconductors 241 to 24n. The transconductor unit 240 receives a plurality of RF phase adjustment signals. The RF signal received by the phase array receiver 200 may be a voltage signal. The plurality of RF amplification signals and the plurality of RF phase adjustment signals may be voltage signals. The first to nth transconductors 241 to 24n convert the voltage signal into a current signal. The first to nth transconductors 241 to 24n convert a plurality of RF phase adjustment signals into a plurality of RF current signals.

The transconductor unit 240 provides a plurality of RF current signals to the frequency mixer 250. When the current signal is provided to the frequency mixer 250, the plurality of RF current signals may have a lower voltage value than when the voltage signal is transmitted. The phase array receiver 200 may transmit a signal with a smaller voltage swing than when transmitting a voltage signal. Therefore, the phase array receiver 200 may obtain high linearity and process a wide band signal as compared with the case of transmitting a voltage signal.

The first to nth transconductors 241 to 24n provide a plurality of RF current signals to a summation node N1. Based on the Kirchhoff current law, the plurality of RF current signals are summed at the summation node N1. That is, the output terminals of the first to nth transconductors 241 to 24n are all electrically connected to the summation node N1. In this case, RF signals inputted to multiple channels may be added without a separate combiner. Therefore, the phase array receiver 200 may be implemented with a small area as compared with the case including the combiner.

The transconductor unit 240 receives a gain control signal GC. The first to nth transconductors 241 to 24n generate a plurality of RF current signals based on the gain control signal GC. The gain control signal GC may be the same signal as the low-noise amplifier control signal LC, but is not limited thereto. The gain control signal GC may be provided to each of the first through nth transconductors 241 to 24n. For example, the gain control signal GC may include first to nth gain control signals. A first gain control signal may be provided to the first transconductor 241 and a second gain control signal may be provided to the second transconductor 242.

The gain control signal GC may determine the current conversion ratio of each of the first to nth transconductors 241 to 24n. For example, the current conversion ratios of the first to nth transconductors 241 to 24n may be different from each other. A transconductor with a high current conversion ratio may output the RF current signal with a high gain, and a transconductor with a low current conversion ratio may output the RF current signal with a low gain. In this case, the first to nth transconductors 241 to 24n may minimize signal reception from side lobes generated in the beam forming process for receiving an RF signal. The low-noise amplification unit 220 may limit the gain adjustment due to the minimization of the noise index. The transconductor unit 240 may additionally control the gain to compensate for the amplification gain limit of the low-noise amplification unit 220.

The frequency mixer 250 receives a sum of a plurality of RF current signals. The frequency mixer 250 is electrically connected to the summation node N1. The frequency mixer 250 receives a sum of a plurality of RF current signals from the summation node N1. The frequency mixer 250 receives the local oscillation signal LO and converts a sum of a plurality of RF current signals into a low frequency band based on the local oscillation signal LO. The frequency mixer 250 may be electrically connected to a local oscillator (not shown) that generates the local oscillation signal LO. The frequency mixer 250 may generate a mixed current signal by multiplying a sum of a plurality of RF current signals by the local oscillation signal LO. At this time, the frequency mixer 250 may be a passive frequency mixer.

The phase array receiver 100 of FIG. 1 is designed by separating the combiner 140 for combining an RF signal applied to multiple channels and the frequency mixer 250 for converting a combined signal into a low frequency band. When implementing a passive frequency mixer that receives a current signal from the phase array receiver 100 of FIG. 1, a separate voltage-current converter is required. The phase array receiver 200 according to the embodiment of FIG. 2 provides the transconductor unit 240 capable of converting RF current signals to improve linearity and easily perform RF signal summation so that a passive frequency mixer may be implemented. In addition, the phase array receiver 200 may provide the transconductor unit 240 capable of minimizing side lobes in a beam forming process for receiving an RF signal.

The transimpedance amplifier 260 receives the mixed current signal from the frequency mixer 250. The transimpedance amplifier 260 converts the mixed current signal into a mixed voltage signal MV. The transimpedance amplifier 260 converts the current signal into a voltage signal. The transimpedance amplifier 260 amplifies the converted current signal to have a low voltage level in the transconductor unit 240 to generate a mixed voltage signal MV having a higher voltage level.

The transimpedance amplifier 260 may receive a transimpedance amplifier control signal TC. The transimpedance amplifier 260 may generate a mixed voltage signal MV based on the transimpedance amplifier control signal TC. The transimpedance amplifier 260 may determine the amplification gain based on the transimpedance amplifier control signal TC. The transimpedance amplifier 260 may determine the voltage conversion ratio based on the transimpedance amplifier control signal TC. The transimpedance amplifier 260 may be implemented with a negative feedback structure to have a small input impedance.

The reception controller 270 may control the low-noise amplification unit 220, the phase adjustment unit 230, the transconductor unit 240, and the transimpedance amplifier 260. The reception controller 270 may generate a low-noise amplifier control signal LC, a phase and gain control signal PC, a gain control signal GC, and a transimpedance amplifier control signal TC. The reception controller 270 may provide the low-noise amplifier control signal LC to the low-noise amplification unit 220. The reception controller 270 may provide the phase and gain control signals PC to the phase adjustment unit 230. The reception controller 270 may provide the gain control signal GC to the transconductor unit 240. The reception controller 270 may provide the transimpedance amplifier control signal TC to the transimpedance amplifier 260.

The reception controller 270 may control the beam for receiving the RF signal of the phase array receiver 200. The reception controller 270 may control the gain of an RF reception device based on the low-noise amplifier control signal LC or the gain control signal GC. The reception controller 270 may control the direction and size of the beam for receiving the RF signal based on the phase and gain control signals PC. The reception controller 270 is not limited to FIG. 2, and may provide various signals for receiving RF signals to the respective components.

The reception controller 270 may provide different low-noise amplifier control signals to the first to nth low-noise amplifiers 221 to 22n. The reception controller 270 may provide different phase and gain control signals to the first through nth phase shifters 231 through 23n. The reception controller 270 may provide different gain control signals to the first to nth transconductors 241 to 24n. As a result, the reception controller 270 may independently control n channels corresponding to the first to nth antennas 211 to 21n. The reception controller 270 may control the size and direction of the beam for receiving RF signals by integrally controlling the phase and gain of the n channels.

Figure 3:
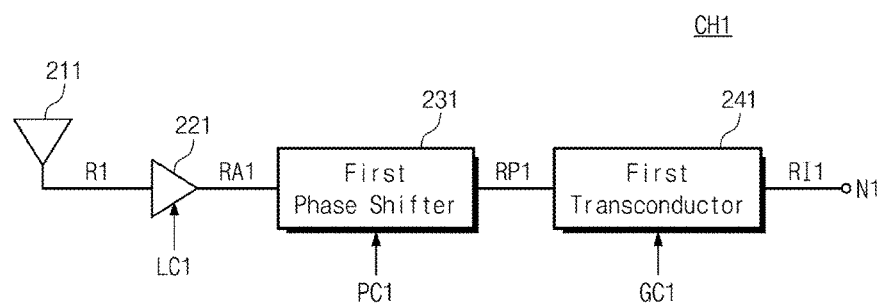
FIG. 3 is a diagram for explaining a signal transmission/reception relationship of a first channel in a phase array receiver of FIG. 2.

FIG. 3 is a diagram for explaining the signal transmission/reception relationship of a first channel in the phase array receiver 200 of FIG. 2. FIG. 3 is a block diagram illustrating components of a first channel CH1. The phase array receiver 200 includes first to nth channels. The first to nth channels all include the same components. The first channel CH1 of the phase array receiver 200 includes a first antenna 211, a first low-noise amplifier 221, a first phase shifter 231, and a first transconductor 241. All other channels of the phase array receiver 200 may include an antenna, a low-noise amplifier, a phase shifter, and a transconductor. That is, the number of antennas, the number of low-noise amplifiers, the number of phase shifters, and the number of transconductors may all be the same in the phase array receiver 200.

The first to nth antennas 211 to 21n receive an RF signal from an external wireless transmission device or the like. Among them, the first antenna 211 receives the first RF signal R1. The first low-noise amplifier 221 receives the first RF signal R1 from the first antenna 211. The first low-noise amplifier 221 may amplify the first RF signal R1 to a first RF amplification signal RA1 based on the first low-noise amplifier control signal LC1. The first low-noise amplifier control signal LC1 is included in the low-noise amplifier control signal LC of FIG. 2. The first low-noise amplifier 221 may receive the first low-noise amplifier control signal LC1 from the reception controller 270 of FIG. 2.

The first phase shifter 231 receives a first RF amplification signal RA1 from the first low-noise amplifier 221. The first phase shifter 231 generates a first RF phase adjustment signal RP1 based on the first phase and gain control signal PC1. The first phase and gain control signal PC1 is included in the phase and gain control signal PC of FIG. 2. The first phase shifter 231 may receive the first phase and gain control signal PC1 from the reception controller 270 of FIG. 2. Also, although not shown in the drawing, the first phase shifter 231 may further receive a gain control signal from the reception controller 270.

The first transconductor 241 receives the first RF phase adjustment signal RP1 from the first phase shifter 231. The first transconductor 241 converts the first RF phase adjustment signal RP1 to the first RF current signal RI1 based on the first gain control signal GC1. The first gain control signal GC1 is included in the gain control signal GC of FIG. 2 The first transconductor 241 may receive the first gain control signal GC1 from the reception controller 270 of FIG. 2. The first transconductor 241 outputs the first RF current signal RI1 to the summation node N1. The first to nth channels output the RF current signals to the summation node N1. That is, the first to nth channels share the summation node N1. The first to nth RF current signals are summed at the summation node N1.

Figure 4:
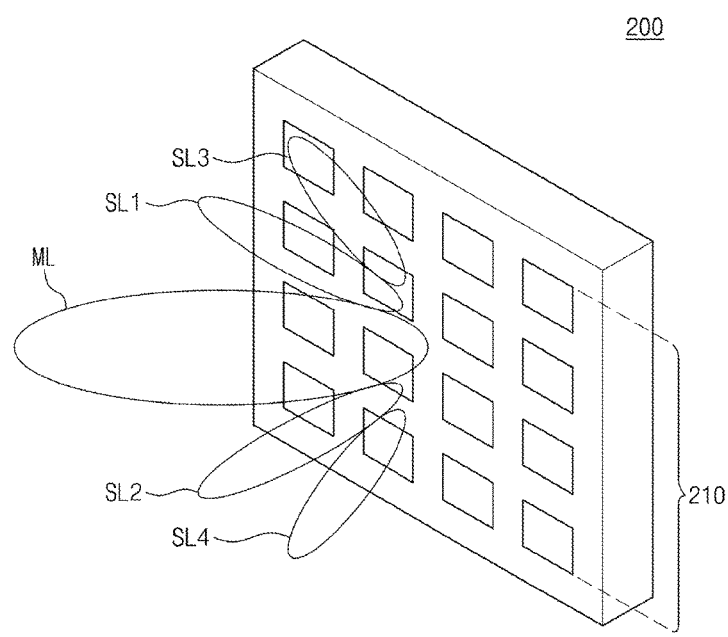
FIG. 4 is a diagram for explaining beam forming of a phase array receiver of FIG. 2.

FIG. 4 is a diagram for explaining beam forming of the phase array receiver of FIG. 2. Referring to FIG. 4, a phase array receiver 200 includes an antenna unit 210 including a plurality of antennas. Illustratively, the antenna unit 210 includes 16 antennas arranged in a 4×4 structure. The phase array receiver 200 forms a beam based on the energy radiated by the plurality of antennas. The phase array receiver 200 may receive wireless RF signals superimposed on the formed beam.

The beam formed by the phase array receiver 200 may include one main lobe ML and a plurality of side lobes SL1 to SL4. The main lobe ML may be defined as a lobe in a direction in which a maximum energy is radiated from a beam formed by the phase array receiver 200. The plurality of side lobes SL1 to SL4 may be defined as lobes in a direction in which energy is radiated in a direction other than the main lobe ML. The plurality of side lobes SL1 to SL4 are formed based on energy smaller than the main lobe ML. The phase array receiver 200 controls the energy radiated from the antenna unit 210 to form the main lobe ML in the reception direction of the RF signal. However, the plurality of side lobes SL1 to SL4 are generated in a direction other than the reception direction of the RF signal in the process of generating the main lobe ML by radiating energy from the plurality of antennas.

The phase array receiver 200 controls the amplitude and phase for a plurality of antennas to form a beam for reception of an RF signal. The phase array receiver 200 may control a plurality of antennas to adjust the direction and size of the beam. The phase array receiver 200 controls the components of the channels corresponding to the plurality of antennas using the reception controller 270 of FIG. 2. The phase array receiver 200 may control the direction of the main lobe ML using the phase adjustment unit 230. The phase array receiver 200 may control the range of the main lobe ML using the low-noise amplification unit 220 and the transconductor unit 240.

The phase array receiver 200 may perform control to minimize the energy provided to the plurality of side lobes SL1 to SL4 by using the low-noise amplification unit 220, the phase adjustment unit 230, and the transconductor unit 240. For example, when the specific antenna has the greatest influence on the formation of the first side lobe SL1, the gain (current conversion ratio) of the phase shifter and the transconductor corresponding to the specific antenna may be controlled to be low. In this case, the transconductor may generate an RF current signal with a smaller gain than the other channel. That is, the phase array receiver 200 according to an embodiment of the inventive concept may control the gain of each of the first to nth transconductors 241 to 24n to minimize the RF signal reception by the plurality of side lobes SL1 to SL4.

Figure 5:
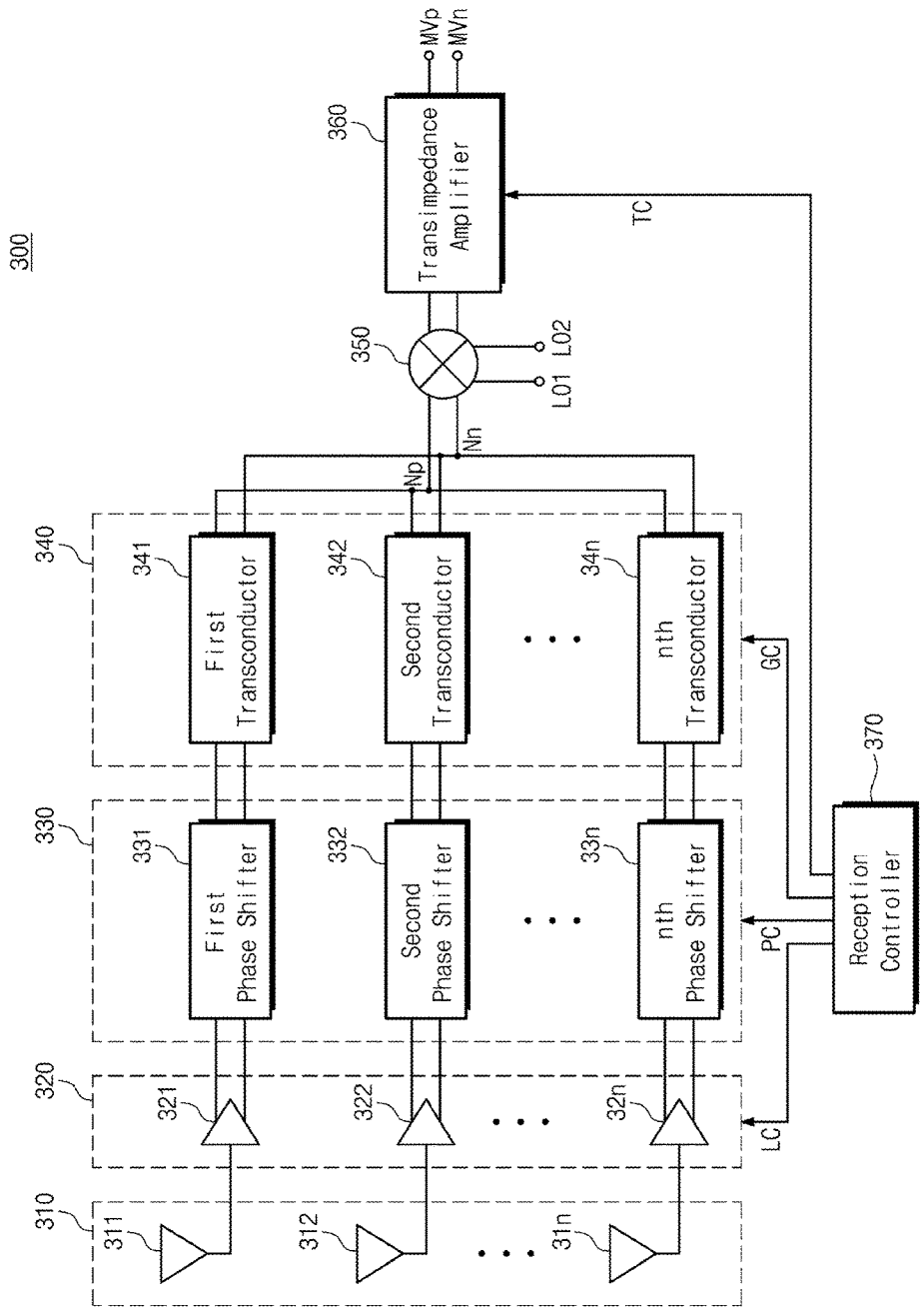
FIG. 5 is a block diagram of a phase array receiver according to another embodiment of the inventive concept.

FIG. 5 is a block diagram of a phase array receiver according to another embodiment of the inventive concept. Referring to FIG. 5, the phase array receiver 300 includes an antenna unit 310, a low-noise amplification unit 320, a phase adjustment unit 330, a transconductor unit 340, a frequency mixer 350, a transimpedance amplifier 360, and a reception controller 370. The phase array receiver 300 is composed of a plurality of channels like the phase array receiver 200 of FIG. 2. Illustratively, the phase array receiver 300 is shown as having n channels. The reception controller 370 performs the same function as the reception controller 270 of FIG. 2, so that a detailed description thereof will be omitted.

The antenna unit 310 includes first to nth antennas 311 to 31n. The first to nth low-noise amplifiers 321 to 32n receive the RF signals from the first to the nth antennas 311 to 31n and output the first to nth RF amplification signals. Unlike the low-noise amplification unit 220 of FIG. 2, the low-noise amplification unit 320 differentially outputs the first to nth RF amplification signals. For example, the first to nth low-noise amplifiers 321 to 32n may include one input terminal electrically connected to the antenna. The first to nth low-noise amplifiers 321 to 32n may include two output terminals for differentially outputting RF amplification signals. However, the inventive concept is not limited thereto, and the first to nth low-noise amplifiers 321 to 32n may include two input terminals electrically connected to the antenna in order to receive the RF signal differentially.

The phase adjustment unit 330 includes first to nth phase shifters 331 to 33n. The first to nth phase shifters 331 to 33n may include two input terminals for receiving differential outputted first to nth RF amplification signals. The first to nth phase shifters 331 to 33n differentially output the first to nth RF phase adjustment signals. The first to nth phase shifters 331 to 33n may include two output terminals for outputting first to nth RF amplification signals.

The transconductor unit 340 includes first to nth transconductors 341 to 34n. The first to nth transconductors 341 to 34n may include two input terminals for receiving differentially outputted first to nth RF phase adjustment signals. The first to nth transconductors 341 to 34n differentially output the first to nth RF current signals. The first to nth transconductors 341 to 34n may include first and second output terminals for outputting RF current signals. The RF current signals outputted from the first to nth transconductors 341 to 34n to the first output terminals may be positive phase signals. The RF current signals outputted from the first to nth transconductors 341 to 34n to the second output terminals may be negative phase signals.

The first output terminals of the first to nth transconductors 341 to 34n are electrically connected to a first summation node Np. The RF current signals provided from the first to nth transconductors 341 to 34n to the first output terminals are summed at the first summation node Np. The second output terminals of the first to nth transconductors 341 to 34n are electrically connected to a second summation node Nn. The RF current signals provided from the first to nth transconductors 341 to 34n to the second output terminals are summed at the second summation node Nn.

The frequency mixer 350 is electrically connected to the first summation node Np and the second summation node Nn. The frequency mixer 350 receives the summed RF positive phase current signals from the first summation node Np. The frequency mixer 350 receives the summed RF negative phase current signals from the second summation node Nn. The frequency mixer 350 receives the positive phase local oscillation signal LO1 and the negative phase local oscillation signal LO2. The frequency mixer 350 differentially outputs the mixed current signal based on the positive phase local oscillation signal LO1 and the negative phase local oscillation signal LO2. The frequency mixer 350 may include two output terminals for differentially outputting the mixed current signals.

The transimpedance amplifier 360 receives the differentially outputted mixed current signals. The transimpedance amplifier 360 may include two input terminals for receiving the differentially outputted mixed current signal. The transimpedance amplifier 360 converts the mixed current signal into a mixed voltage signal. The transimpedance amplifier 360 differentially outputs the mixed voltage signal. The transimpedance amplifier 360 may include first and second output terminals for differentially outputting the mixed voltage signal. The mixed voltage signal may include a mixed positive phase voltage signal MVp outputted to the first output terminal and a mixed negative phase voltage signal MVn outputted to the second output terminal.

Figure 6:
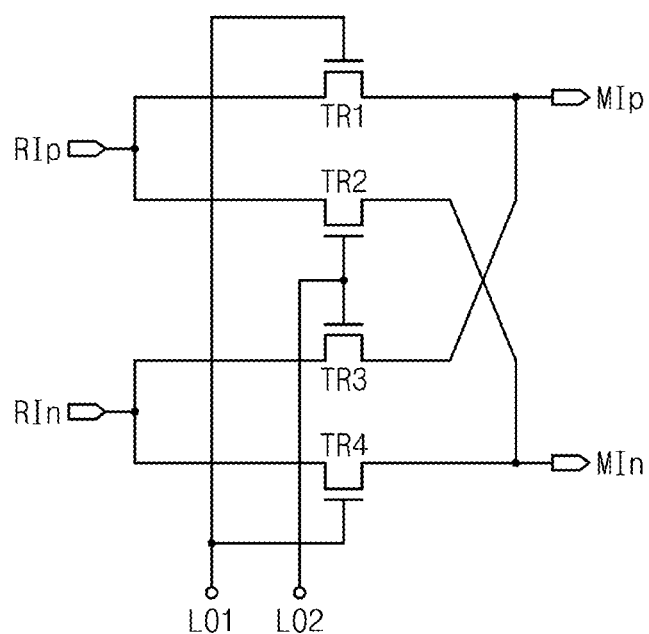
FIG. 6 is a circuit diagram showing an embodiment of a frequency mixer of FIG. 5.

FIG. 6 is a circuit diagram showing an embodiment of the frequency mixer of FIG. 5. Referring to FIG. 6, the frequency mixer 350 includes first to fourth transistors TR1 to TR4. The first to fourth transistors TR1 to TR4 may be N-channel metal oxide semiconductor (NMOS) transistors, but are not limited thereto. The frequency mixer 350 may be a passive frequency mixer because no separate power source is required. The frequency mixer 350 may output a mixed current signal having an output frequency band lower than the RF current signal based on the positive phase local oscillation signal LO1 and the negative phase local oscillation signal LO2.

The first to fourth transistors TR1 to TR4 include an input terminal, a control terminal, and an output terminal. The input terminal of the first transistor TR1 and the input terminal of the second transistor TR2 receive the summed RF positive phase current signal RIp. The control terminal of the first transistor TR1 receives the positive phase local oscillation signal LO1. The control terminal of the second transistor TR2 receives the negative phase local oscillation signal LO2. The input terminal of the third transistor TR3 and the input terminal of the fourth transistor TR4 receive the summed RF negative phase current signal RIn. The control terminal of the third transistor TR3 receives the negative phase local oscillation signal LO2. The control terminal of the fourth transistor TR4 receives the positive phase local oscillation signal LO1.

The output terminal of the first transistor TR1 and the output terminal of the third transistor TR3 are electrically connected and output a mixed positive phase current signal MIp. The output terminal of the second transistor TR2 and the output terminal of the fourth transistor TR4 are electrically connected and output a mixed negative phase current signal MIn. That is, the frequency mixer 350 differentially receives the RF current signal and differentially outputs the mixed current signal. The frequency mixer 350 of FIG. 5 is not limited to the structure of FIG. 6, and may have various circuit structures that down convert to an output frequency band lower than the RF current signal.

Figure 7:
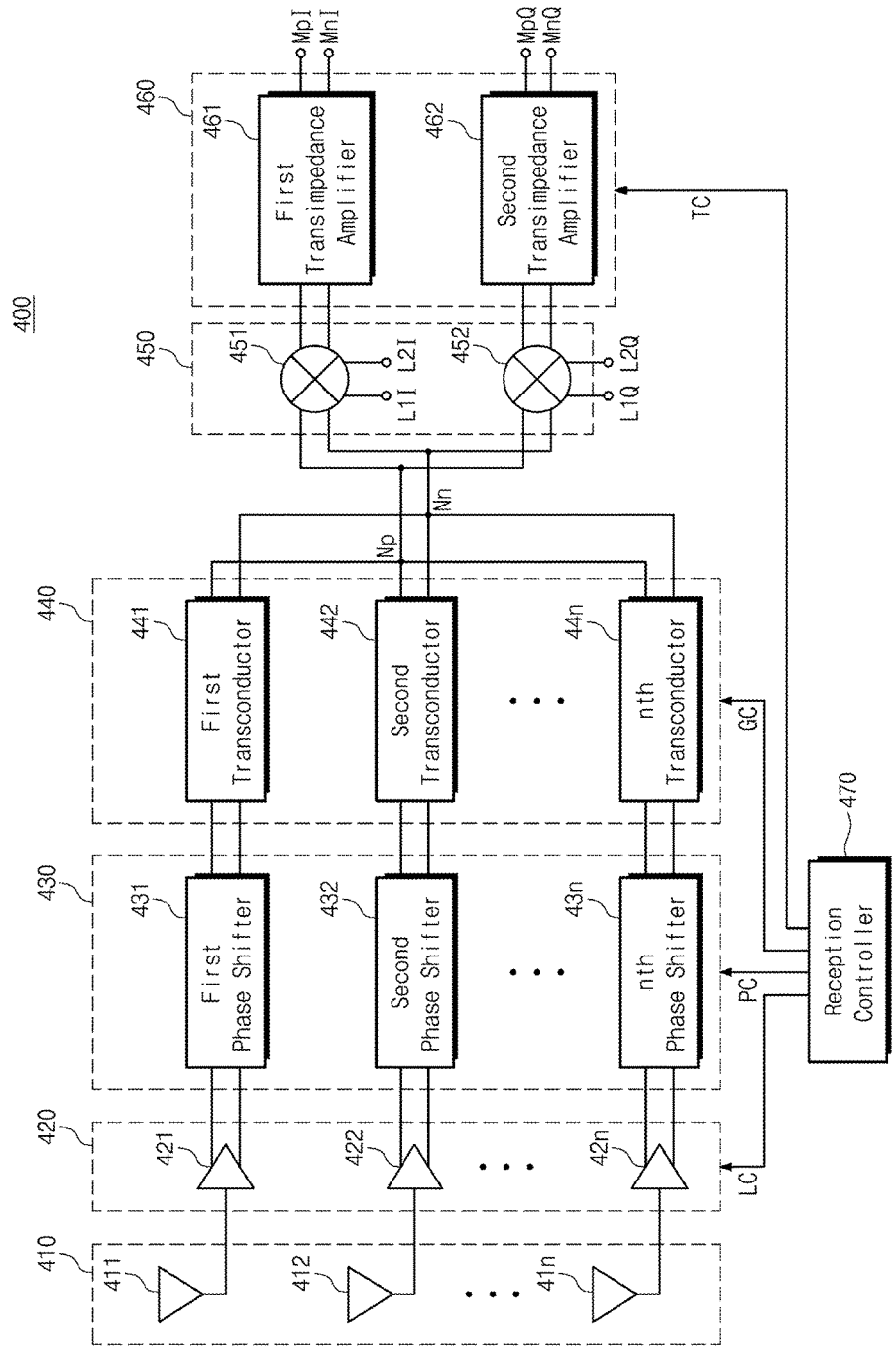
FIG. 7 is a block diagram of a phase array receiver according to another embodiment of the inventive concept.

FIG. 7 is a circuit diagram of a phase array receiver according to another embodiment of the inventive concept. Referring to FIG. 7, a phase array receiver 400 includes an antenna unit 410, a low-noise amplification unit 420, a phase adjustment unit 430, a transconductor unit 440, a frequency mixer 450, a transimpedance amplifier 460, and a reception controller 470. The antenna unit 410 includes first to nth antennas 411 to 41n. The low-noise amplification unit 420 includes first to nth low-noise amplifiers 421 to 42n. The phase adjustment unit 430 includes first to nth phase shifters 431 to 43n. The transconductor unit 440 includes first to nth transconductors 441 to 44n. The antenna unit 410, the low-noise amplification unit 420, the phase adjustment unit 430, the transconductor unit 440, and the reception controller 470 correspond to the antenna unit 310, the low-noise amplification unit 320, the phase adjustment unit 330, the transconductor unit 340, and the reception controller 370, and thus a detailed description thereof will be omitted.

The frequency mixer 450 includes a first frequency mixer 451 and a second frequency mixer 452. The frequency mixer 450 receives the summed RF current signal generated by the transconductor unit 440. The RF current signal may include an RF positive phase current signal and an RF negative phase current signal. The frequency mixer 450 may receive the summed RF positive phase current signal from the first summation node Np. The frequency mixer 450 may receive the summed RF negative phase current signal from the second summation node Nn. The summed RF positive phase current signal and the summed RF negative phase current signal may be provided to the first frequency mixer 451 and the second frequency mixer 452.

The first frequency mixer 451 receives a first local oscillation signal. The first local oscillation signal includes a first positive phase local oscillation signal L1I and a first negative phase local oscillation signal L2I. The first frequency mixer 451 may differentially output the first mixed current signal based on the first positive phase local oscillation signal L1I and the first negative phase local oscillation signal L2I. The first mixed current signal may be an In-phase (I) channel signal. The first frequency mixer 451 may be the passive frequency mixer as shown in FIG. 6, but is not limited thereto.

The second frequency mixer 452 receives a second local oscillation signal. The second local oscillation signal includes a second positive phase local oscillation signal L1Q and a second negative phase local oscillation signal L2Q. The first local oscillation signal and the second local oscillation signal may be phase-orthogonal to each other. The second frequency mixer 452 may differentially output the second mixed current signal based on the second positive phase local oscillation signal L1Q and the second negative phase local oscillation signal L2Q. The second mixed current signal may be a quadrature-phase (Q) channel signal. The second frequency mixer 452 may be the passive frequency mixer as shown in FIG. 6, but is not limited thereto.

The transimpedance amplifier 460 includes a first transimpedance amplifier 461 and a second transimpedance amplifier 462. The first transimpedance amplifier 461 receives the first mixed current signal from the first frequency mixer 451. The first transimpedance amplifier 461 may include two input terminals for receiving the first mixed current signal. The first transimpedance amplifier 461 converts the first mixed current signal into a first mixed voltage signal. The first mixed voltage signal may be an I channel signal. The first transimpedance amplifier 461 may output the first mixed voltage signal differentially. In this case, the first mixed voltage signal includes a first positive phase mixed voltage signal MpI and a first negative phase mixed voltage signal MnI.

The second transimpedance amplifier 462 receives the second mixed current signal from the second frequency mixer 452. The second transimpedance amplifier 462 may include two input terminals for receiving the second mixed current signal. The second transimpedance amplifier 462 converts the second mixed current signal into a second mixed voltage signal. The second mixed voltage signal may be a Q channel signal that is phase-orthogonal to the first mixed voltage signal. The second transimpedance amplifier 462 may output the second mixed voltage signal differentially. In this case, the second mixed voltage signal includes a second positive phase mixed voltage signal MpQ and a second negative phase mixed voltage signal MnQ.

The first transimpedance amplifier 461 and the second transimpedance amplifier 462 may generate the first mixed voltage signal and the second mixed voltage signal based on the transimpedance amplifier control signal TC. The first transimpedance amplifier 461 and the second transimpedance amplifier 462 may determine the current conversion ratio based on the transimpedance amplifier control signal TC. Although it is shown that each component outputs signals differentially, the phase array receiver 400 is not limited thereto and may output each signal as a single output.

The phase array receiver according to an embodiment of the inventive concept uses a plurality of transconductors for converting an RF voltage signal into a current signal, so that the linearity of the signal processing may be improved, signals of a wider band may be processed, it may be implemented with a smaller size.

Although the exemplary embodiments of the inventive concept have been described, it is understood that the inventive concept should not be limited to these exemplary embodiments but various changes and modifications can be made by one ordinary skilled in the art within the spirit and scope of the inventive concept as hereinafter claimed.

What is claimed is:

1. A phase array receiver comprising:
a plurality of antennas configured to receive RF signals;
a plurality of low-noise amplifiers configured to receive the RF signals from the plurality of antennas and amplify the RF signals to generate a plurality of RF amplification signals;
a plurality of phase shifters configured to adjust a gain and a phase of the plurality of RF amplification signals to generate a plurality of RF phase adjustment signals;
a plurality of transconductors configured to convert the plurality of RF phase adjustment signals into a plurality of RF current signals based on a gain control signal;
a passive frequency mixer configured to receive a sum of the plurality of RF current signals and convert a frequency of the plurality of RF current signals to generate a mixed current signal; and
a transimpedance amplifier configured to convert the mixed current signal into a mixed voltage signal.

2. The phase array receiver of claim 1, wherein the plurality of transconductors are electrically connected to a summation node and outputs the plurality of RF current signals to the summation node,
wherein the passive frequency mixer receives the sum of the plurality of RF current signals from the summation node.

3. The phase array receiver of claim 1, wherein the passive frequency mixer generates the mixed current signal having a lower output frequency band than the sum of the plurality of RF current signals based on a local oscillation signal.

4. The phase array receiver of claim 1, wherein the passive frequency mixer comprises:
a first passive frequency mixer configured to generate a first mixed current signal having a lower output frequency band than the sum of the plurality of RF current signals based on a first local oscillation signal; and
a second passive frequency mixer configured to generate a second mixed current signal having a lower output frequency band than the sum of the plurality of RF current signals based on a second local oscillation signal orthogonal to the first local oscillation signal,
wherein the transimpedance amplifier comprises:
a first transimpedance amplifier configured to convert the first mixed current signal to a first mixed voltage signal; and
a second transimpedance amplifier configured to convert the second mixed current signal to a second mixed voltage signal.

5. The phase array receiver of claim 1, further comprising a reception controller configured to generate the gain control signal.

6. The phase array receiver of claim 5, wherein the reception controller provides a phase and gain control signal to the plurality of phase shifters, determines a reception direction of the RF signals based on the phase and gain control signal, and minimizes a side lobe.

7. The phase array receiver of claim 5, wherein the reception controller controls a current conversion ratio of each of the plurality of transconductors based on the gain control signal.

8. The phase array receiver of claim 7, wherein the reception controller provides a low-noise amplifier control signal to the plurality of low-noise amplifiers and controls an amplification gain of each of the plurality of low-noise amplifiers based on the low-noise amplifier control signal.

9. The phase array receiver of claim 1,
wherein the plurality of low-noise amplifiers differentially output the plurality of RF amplification signals to the plurality of phase shifters,
wherein the plurality of phase shifters differentially output the plurality of RF phase adjustment signals to the plurality of transconductors,
wherein the plurality of transconductors differentially output the plurality of RF current signals to the frequency mixer,
wherein the frequency mixer sums and receives the plurality of differentially outputted RF current signals to differentially output the mixed current signal,
wherein the transimpedance amplifier receives the differentially outputted mixed current signal and differentially outputs the mixed voltage signal.

10. A phase array receiver comprising:
a plurality of antennas configured to receive RF signals;
a plurality of phase shifters configured to determine a reception direction of the RF signals of the plurality of antennas;
a plurality of transconductors configured to convert a plurality of voltage signals generated based on the RF signals into a plurality of RF current signals and output the plurality of RF current signals to a summation node;
a reception controller configured to provide the plurality of transconductors with a gain control signal for controlling a current conversion ratio of each of the plurality of transconductors;
a frequency mixer configured to receive a sum of the plurality of RF current signals from the summation node and generate a mixed current signal having a lower output frequency band than the sum of the plurality of RF current signals; and
a transimpedance amplifier configured to convert the mixed current signal into a mixed voltage signal.

11. The phase array receiver of claim 10, further comprising a plurality of low-noise amplifiers configured to receive the RF signals from the plurality of antennas and amplify the RF signals to provide a plurality of RF amplification signals to the plurality of phase shifters.

12. The phase array receiver of claim 11, wherein the plurality of phase shifters adjust a phase of the plurality of RF amplification signals to provide a plurality of RF phase adjustment signals to the plurality of transconductors,
wherein the reception controller provides a phase control signal determining a phase shift amount of each of the plurality of phase shifters to the plurality of phase shifters.

13. The phase array receiver of claim 10, wherein the reception controller controls a current conversion ratio of the plurality of transconductors to minimize a side lobe and controls a gain of the plurality of phase shifters.

14. The phase array receiver of claim 10, wherein the plurality of transconductors have the same number as the plurality of antennas.

15. A phase array receiver comprising:
a plurality of antennas configured to receive RF signals;
a plurality of low-noise amplifiers configured to receive the RF signals from the plurality of antennas and amplify the RF signals to generate a plurality of RF amplification signals;
a plurality of phase shifters configured to adjust a gain and a phase of the plurality of RF amplification signals to generate a plurality of RF phase adjustment signals;

a plurality of transconductors configured to convert the plurality of RF phase adjustment signals into a plurality of RF current signals based on a gain control signal;

a frequency mixer configured to receive a sum of the plurality of RF current signals and convert a frequency of the plurality of RF current signals based on a local oscillation signal to generate a mixed current signal; and a transimpedance amplifier configured to convert the mixed current signal into a mixed voltage signal.

* * * * *